(12) United States Patent
Matsuda et al.

(10) Patent No.: US 6,599,562 B2
(45) Date of Patent: Jul. 29, 2003

(54) RIGID-PRINTED WIRING BOARD AND PRODUCTION METHOD OF THE RIGID-PRINTED WIRING BOARD

(75) Inventors: Yoshinari Matsuda, Kanagawa (JP); Tomohide Koguchi, Ibaraki (JP)

(73) Assignees: Sony Corporation, Tokyo (JP); Shirato Printed Circuit Board Co. Ltd., Ibaraki-ken (JP)

( * ) Notice: Subject to any disclaimer, the term of this patent is extended or adjusted under 35 U.S.C. 154(b) by 0 days.

(21) Appl. No.: 10/157,489

(22) Filed: May 28, 2002

(65) Prior Publication Data
US 2002/0182398 A1 Dec. 5, 2002

Related U.S. Application Data

(62) Division of application No. 09/599,303, filed on Jun. 22, 2000, now Pat. No. 6,420,017.

(30) Foreign Application Priority Data

Jun. 23, 1999 (JP) ............................................. 11-177497

(51) Int. Cl.$^7$ ................................................. B05D 5/12
(52) U.S. Cl. ...................... 427/97; 428/209; 174/261; 174/264
(58) Field of Search ................................ 174/262, 264, 174/266, 261; 428/209; 427/97

(56) References Cited

U.S. PATENT DOCUMENTS

| | | | | |
|---|---|---|---|---|
| 5,010,448 A | | 4/1991 | Kobari | |
| 5,484,647 A | * | 1/1996 | Nakatani et al. | 428/209 |
| 5,780,143 A | | 7/1998 | Shimamoto et al. | |
| 6,050,832 A | | 4/2000 | Lee et al. | |
| 6,084,782 A | | 7/2000 | Huyuh et al. | |
| 6,096,411 A | * | 8/2000 | Nakatani et al. | 428/209 |
| 6,106,923 A | | 8/2000 | Takahashi et al. | |
| 6,180,215 B1 | | 1/2001 | Sprietsma et al. | |
| 6,217,343 B1 | | 4/2001 | Okuno | |
| 6,222,135 B1 | | 4/2001 | Daido et al. | |

* cited by examiner

Primary Examiner—Cathy Lam
(74) Attorney, Agent, or Firm—Frommer Lawrence & Haug LLP; William S. Frommer

(57) ABSTRACT

The present invention is for providing a rigid-printed wiring board capable of preventing the burst or void phenomenon of a copper paste, and a production method of the rigid-printed wiring board. A rigid-printed wiring board comprising copper clad laminates with a paper phenol or a paper epoxy used as a base, wherein a through hole is provided in the vicinity of a via hole for filling the copper paste, is provided.

2 Claims, 5 Drawing Sheets

RIGID-PRINTED WIRING BOARD AND PRODUCTION METHOD OF THE RIGID-PRINTED WIRING BOARD

This application is a divisional of prior application Ser. No. 09/599,303 filed on Jun. 22, 2000, now U.S. Pat. No. 6,420,017.

BACKGROUND OF THE INVENTION

1. Field of the Invention

The present invention relates to a rigid-printed wiring board having via holes, and a production method of the rigid-printed wiring board.

2. Description of the Related Art

Printed wiring boards called copper paste through hole PWB (rigid-printed wiring boards) utilize copper clad laminates for rigid-printed wiring boards with a paper phenol or a paper epoxy used as a base.

Some of these kinds of the rigid-printed wiring boards (hereinafter abbreviated as PWB) often used in electronic appliances have a via hole 1000 as shown in FIGS. 8 and 9. The via hole 1000 is provided by filling a copper paste 1003 on copper foils 1002 on the front and rear sides of a rigid-printed wiring board substrate 1001, and it is used only for the electric conduction between the copper foils 1002 on the front and rear sides of the substrate 1001. That is, a component lead, or the like, is not provided through the via hole 1000, and thus it is a kind of the through hole to be used only for the conduction between the wirings on the front and rear sides of the substrate 1001. The diameter of the hole is, about 0.3 to 0.8 mm.

However, such a rigid-printed wiring board involves the following problems.

In general, it is completed by a step of filling a prepared hole of the via hole 1000 with the liquid copper paste 1003, a drying step at about 60 to 100° C., and a thermal curing step at 150 to 160° C. In the case the base is a paper phenol substrate, the volatile component such as methanol, 1-butanol, 2-methyl-1-propanol, formaldehyde, toluene and salicylaldehyde contained in the substrate resin component, and moisture contained in the paper material are generated as an out gas. This gives rise to a failure in the copper paste 1003, such as the burst (bulge) part 1004 as shown in FIG. 8 and the void (bubble) part 1005 as shown in FIG. 9.

Particularly in the case when a via hole is disposed in the solid copper foil part, since the solid copper foil on the substrate surface serves as a barrier to the out gas, the out gas to be discharged tends to concentrate at a via hole cross-section so as to cause the burst void phenomenon frequently.

Moreover, in the case of a paper epoxy substrate, although the amount is smaller than that of the phenol substrate, the out gas of the volatile component and moisture is generated similarly in the drying and thermal curing steps.

SUMMARY OF THE INVENTION

Accordingly, an object of the present invention is to provide a rigid-printed wiring board capable of solving the above-mentioned problems as well as preventing the burst or void phenomenon of the copper paste, and a production method of the rigid-printed wiring board.

A first aspect of the present invention is a rigid-printed wiring board comprising copper clad laminates with a paper phenol or a paper epoxy used as a base, wherein a through hole is provided in the vicinity of a via hole for filling a copper paste.

According to the first aspect, since the through hole is provided in the vicinity of the via hole for filling the copper paste, the out gas can be discharged from the through hole so that generation of the burst phenomenon or the void phenomenon can be restrained drastically.

A second aspect of the present invention is the rigid-printed wiring board according to the first aspect, wherein one or a plurality of the through holes are provided and the through hole has a circular shape.

A third aspect of the present invention is the rigid-printed wiring board according to the first aspect, wherein one or a plurality of the through holes are provided and the through hole has a linear shape.

A fourth aspect of the present invention is the rigid-printed wiring board according to the first aspect, wherein one or a plurality of the through holes are provided and the through hole has a curved shape.

A fifth aspect of the present invention is a rigid-printed wiring board comprising copper clad laminates with a paper phenol or a paper epoxy used as a base, wherein a copper foil land for a via hole for filling a copper paste and a copper foil part in the periphery thereof are formed separately such that the copper foil land for the via hole and the copper foil part in the periphery thereof are connected electrically so as for a copper foil non-formation part to be provided between the copper foil land for the via hole and the copper foil part in the periphery thereof.

According to the fifth aspect, since the copper foil land for the via hole and the land in the periphery thereof are connected electrically so as for the copper foil non-formation part to be provided between the copper foil land for the via hole and the land in the periphery thereof, the out gas can be released from the surface without the copper foil so that generation of the burst phenomenon or the void phenomenon of the copper paste can be cut back.

A sixth aspect of the present invention is the rigid-printed wiring board according to the fifth aspect, wherein the copper foil land for the via hole and the land in the periphery thereof are connected electrically by a fine line copper foil land.

A seventh aspect of the present invention is a production method of a rigid-printed wiring board comprising copper clad laminates with a paper phenol or a paper epoxy used as a base, comprising the steps of providing a through hole in the vicinity of a via hole for filling a copper paste, filling the copper paste in the via hole, drying as well as thermally curing it.

According to the seventh aspect, in filling the copper paste in the via hole, drying as well as thermally curing it, the out gas can be discharged from the through hole to the outside so that generation of the burst phenomenon or the void phenomenon of the copper paste can be restrained drastically.

An eighth aspect of the present invention is a production method of a rigid-printed wiring board comprising copper clad laminates with a paper phenol or a paper epoxy used as a base, wherein a copper foil land for a via hole for filling a copper paste and a copper foil part in the periphery thereof are formed separately such that the copper foil land for the via hole and the copper foil part in the periphery thereof are connected electrically so as for a copper foil non-formation part to be provided between the copper foil land for the via hole and the copper foil part in the periphery thereof, comprising the steps of filling the copper paste in the via hole, drying as well as thermally curing it.

According to the eighth aspect, in filling the copper paste in the via hole, drying as well as thermally curing it, the out gas can be released from the copper foil non-formation part provided between the copper foil land for the via hole and the land in the periphery thereof, that is, from the surface without the copper foil so that generation of the burst phenomenon or the void phenomenon of the copper paste can be cut back.

DETAILED DESCRIPTION OF THE PREFERRED EMBODIMENT

Hereinafter, embodiments of the present invention will be explained in detail with reference to the accompanied drawings.

Since the embodiments described below are preferable concrete examples of the present invention, various kinds of technologically preferable limitations are attached. However, the range of the present invention is not limited to the embodiments unless there is any descriptions of the present invention being limited in the following explanation.

Figure 1A:
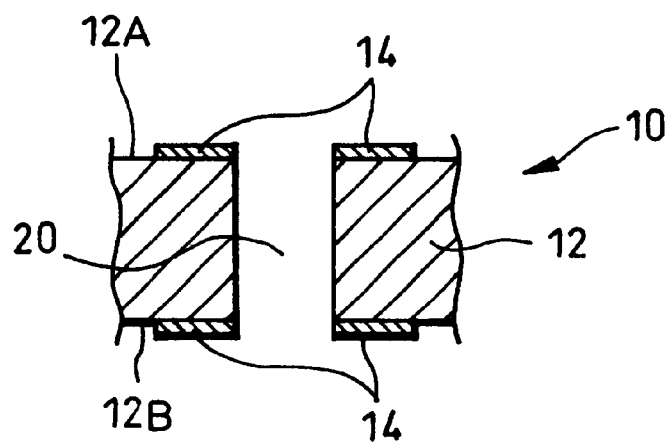
FIGS. 1A TO 1C are diagrams showing the copper paste through hole forming step in a rigid-printed wiring board according to the present invention.
Figure 1B:
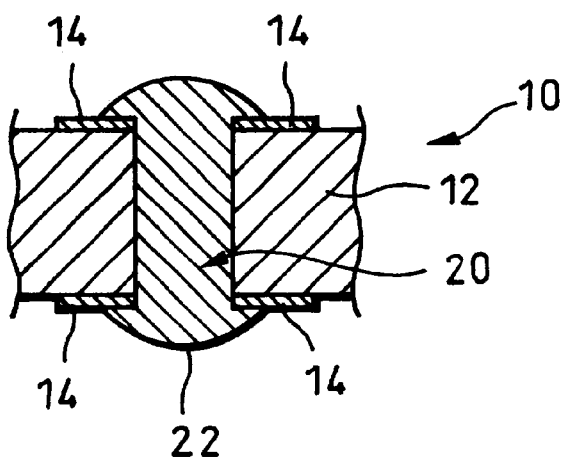
Figure 1C:
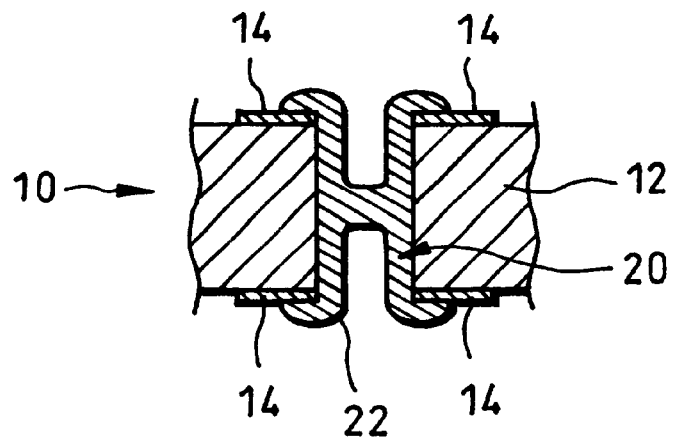

FIGS. 1A to 1C show an example of a copper paste through hole forming step.

A rigid-printed wiring board 10 is produced by using copper clad laminates of an inexpensive material, that is, a paper phenol or a paper epoxy used as a base thereof. The copper clad laminates (hereinafter referred to simply as a substrate) 12 of the rigid-printed wiring board 10 can be produced as follows.

As shown in FIG. 1A, after forming copper foil 14 each on the upper surface 12A and the lower surface 12B of the substrate 12 by way of patterning, a via hole (through hole) 20 is formed by using a drill.

Next, as shown in FIG. 1B, after filling the via hole 20 with a liquid copper paste 22, a drying process at about 60 to 100° C., and a thermal curing step at 150 to 160° C. are executed so as to complete the via hole 20 having the copper paste 22. At the time, the copper paste 22 is filled in the via hole 20 by, for example, screen printing.

FIG. 1C shows the state after drying and thermal curing of the copper paste 22.

Figure 8:
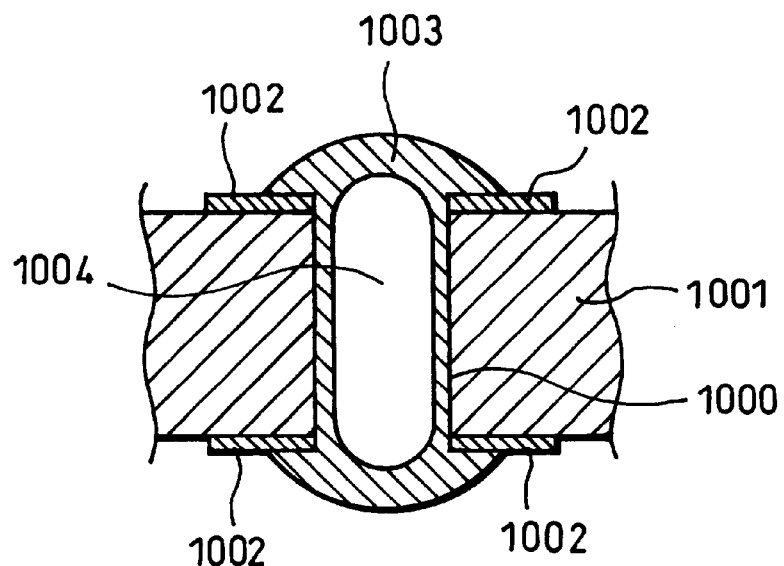
FIG. 8 is a cross-sectional view showing the burst phenomenon of a copper paste in a conventional rigid-printed wiring board.
Figure 9:
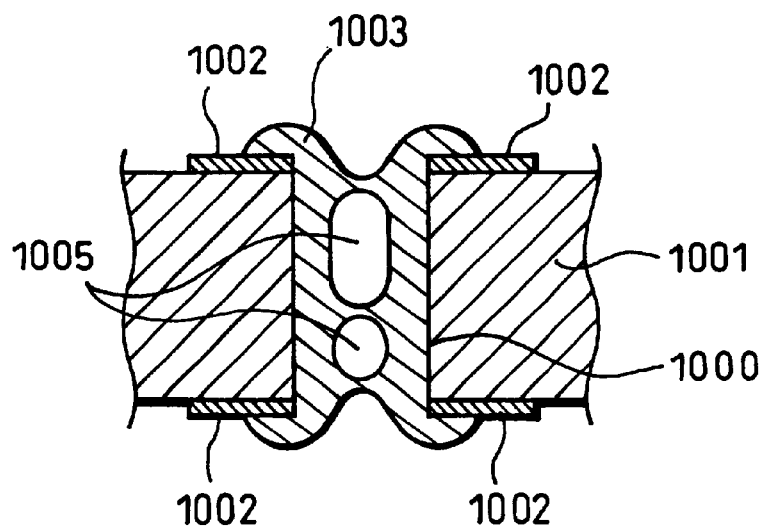
FIG. 9 is a cross-sectional view showing the void phenomenon of a copper paste in a conventional rigid-printed wiring board.

In the case a paper phenol substrate is used as the substrate, the volatile component such as methanol, 1-butanol, 2-methyl-1-propanol, formaldehyde, toluene and salicylaldehyde contained in the substrate resin component are generated conventionally as an out gas in the drying and thermal curing steps, resulting in the cause of a failure in the copper paste, such as the burst (bulge) part 1004 and the void (bubble) part 1005 as shown in FIGS. 8 and 9. Particularly in the case of a via hole disposed in the solid copper foil part, since the copper foil on the substrate surface serves as the barrier to the out gas, the out gas tends to concentrate at the via hole cross-section causing the burst void phenomenon frequently.

Figure 2:
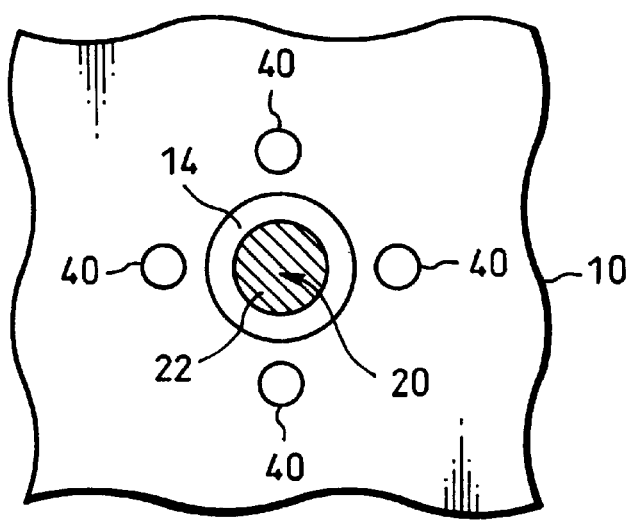
FIG. 2 is a diagram showing an example of a through hole provided in the vicinity of a via hole.

However, according to an embodiment of the present invention, in order to prevent the above-mentioned burst and void phenomena in the copper paste, one or a plurality of through holes 40 are formed in the vicinity of a copper foil 14 (also referred to as via hole land) in the periphery of a via hole 20 as shown in FIG. 2. The out gas can be discharged from the through holes 40 to the outside so as to prevent accumulation of the out gas in the copper paste. That is, by providing the through holes 40 for degassing in the periphery of the via hole for preventing an influence of the volatile components on the formation of a copper paste 22 in the via hole 20, the generation rate of the burst phenomenon or the void phenomenon can be restrained drastically.

The through holes (also referred to as degassing holes) 40 can be provided by forming a hole with a drill, a router, or by a metal punching process before executing the screen printing of the copper paste shown in FIG. 1B, and prebaking a substrate 12 at about 150° C. before the copper paste printing.

Figure 3:
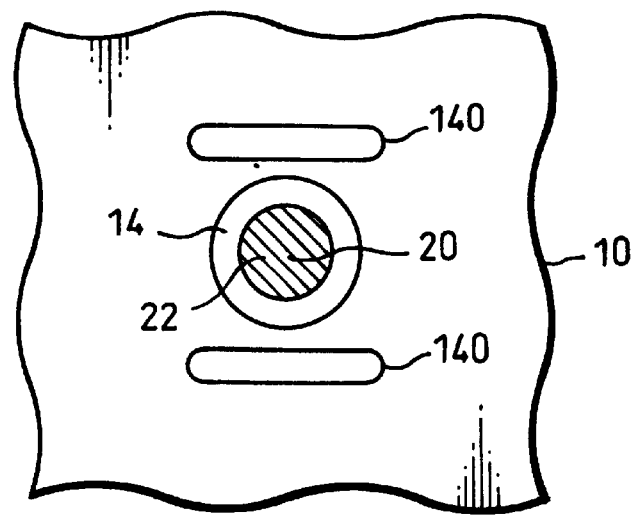
FIG. 3 is a diagram showing an example of another through hole provided in the vicinity of a via hole.
Figure 4:
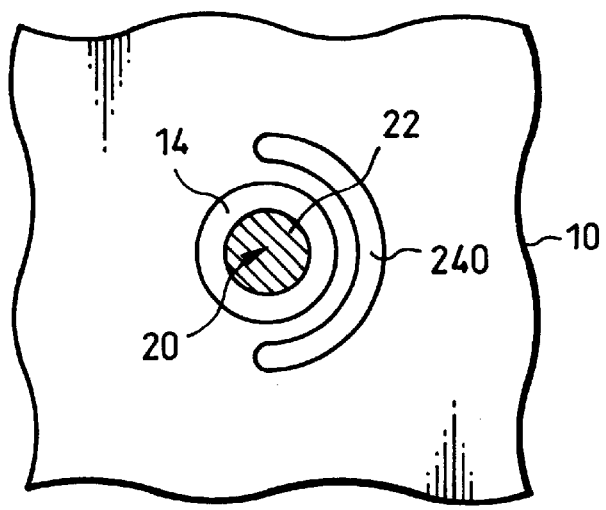
FIG. 4 is a diagram showing an example of still another through hole provided in the vicinity of a via hole.

FIGS. 3 and 4 show other embodiments.

The through hole 40 in FIG. 2 has a circular shape whereas the through hole 140 in FIG. 3 has a slit-like shape, or a linear long shape. The through hole 140 is to be singularly or plurally formed. In the embodiment of FIG. 3, two through holes 140, 140 are formed on the opposite sides of the via hole 20.

The through hole 240 in FIG. 4 has a semi-circular shape, or a curved slit-like shape. The through hole 240 is formed in an about 180° angular range around the via hole 20. One or a plurality of the through holes 240 can be formed.

A comparison between the generation rate of the burst in the via hole disposed in the conventional solid copper foil and the generation rate of the burst in the embodiment of the present invention is as follows. The effects can be observed. In this case, a substrate of a paper phenol MCL-437F produced by Hitachi Kasei Kogyo Corp. with a 1.6 mm thickness was used with a 0.6 mm drill diameter for the via hole formation. A copper paste NF2000 produced by Tatsuta Densen Corp. was used. The gas holes with a 0.6 mm diameter were provided at four points with a 1.8 mm pitch from the via center.

TABLE 1

| | Conventional example | Embodiment of the present invention |
|---|---|---|
| Burst generation ratio | 100% | 1.2% |

Next, another embodiment of the present invention for preventing the above-mentioned burst and void phenomena in the copper paste by the out gas will be explained.

Figure 5:
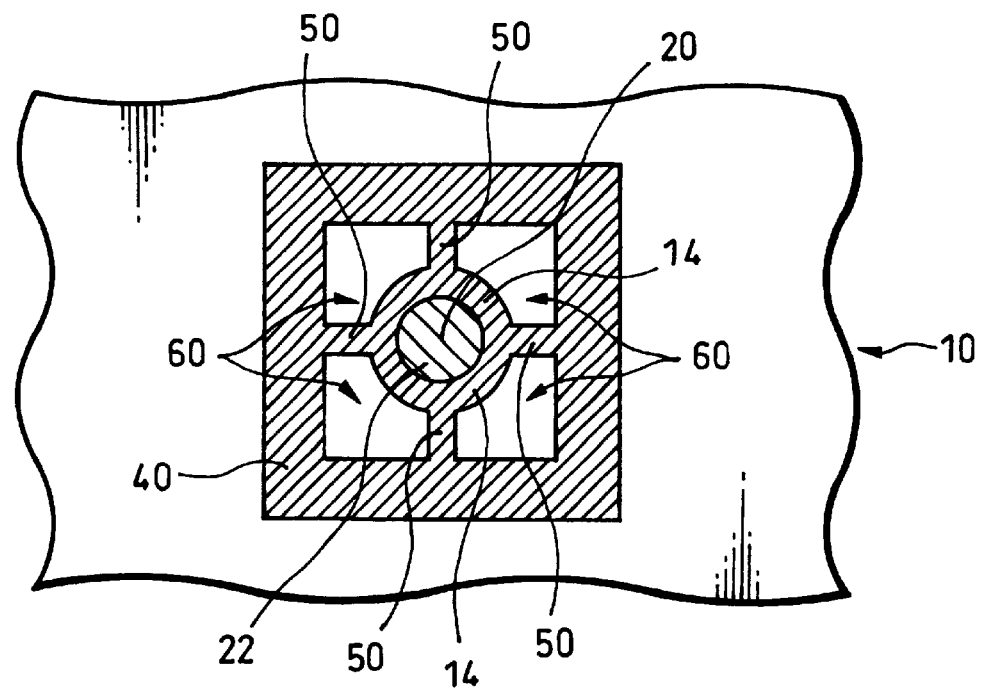
FIG. 5 is a diagram showing an example of a copper foil non-formation part provided in the vicinity of a via hole.

In FIG. 5, in order to reduce or eliminate the burst phenomenon and the void phenomenon of the copper paste in the via hole disposed on the solid copper foil, the copper foil (via hole land) 14 in the periphery of the via hole 20 is not circumferentially electrically connected to the so-called peripheral solid copper foil 40, but comprises a copper foil non-formation part 60. That is, the circular or ring-like copper foil 14 and the solid copper foil 40 in the periphery thereof are connected to each other electrically by a fine line copper foil land 50.

In the embodiment of FIG. 5, the solid copper foil 40 and the copper foil 14 are connected electrically by the four fine line-like copper foil lands 50. Therefore, the copper foil non-formation parts 60 are the portions surrounded by the solid copper foil 40, the fine line-like copper foil land 50, and the copper foil 14. A copper foil is not provided in the non-formation part 60.

Therefore, the ring-like copper foil 14 as the land for the via hole and the solid copper foil 40 are not circumferentially connected but are made to be independent of each other. By partially bridging them electrically by the fine line-like copper foil land 50, the out gas can be released outside from the surface of the copper foil non-formation part 60, and thus the burst phenomenon and the void phenomenon by the out gas in the copper paste can be cut back.

Figure 6:
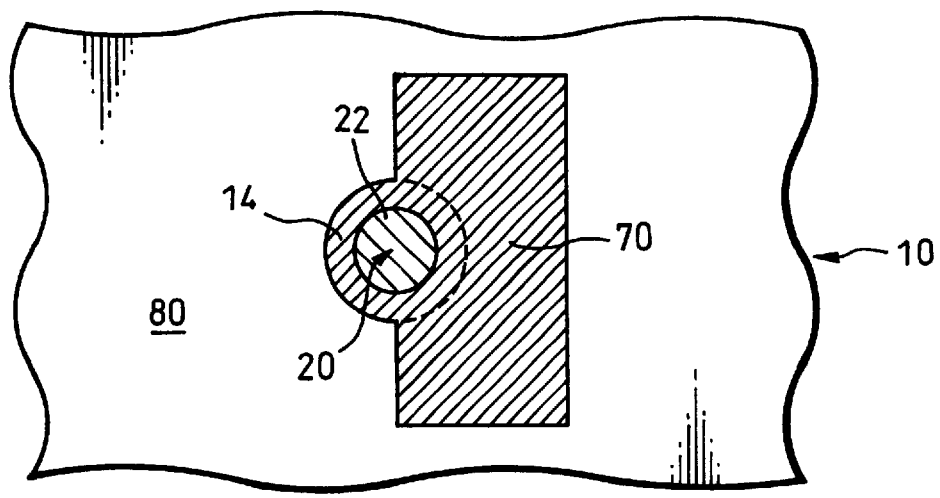
FIG. 6 is a diagram showing an example of another copper foil non-formation part provided in the vicinity of a via hole.

FIG. 6 shows another embodiment, with a solid copper foil 70 connected electrically along the half of the peripheral part of the copper foil 14, but the surface of the rigid-printed wiring board 10 corresponding to the other half of the peripheral part of the copper foil 14 is a copper foil non-formation part 80.

Accordingly, since the out gas can be released from the copper foil non-formation part 80, the burst phenomenon and the void phenomenon by the out gas in the copper paste can be cut back.

Figure 7:
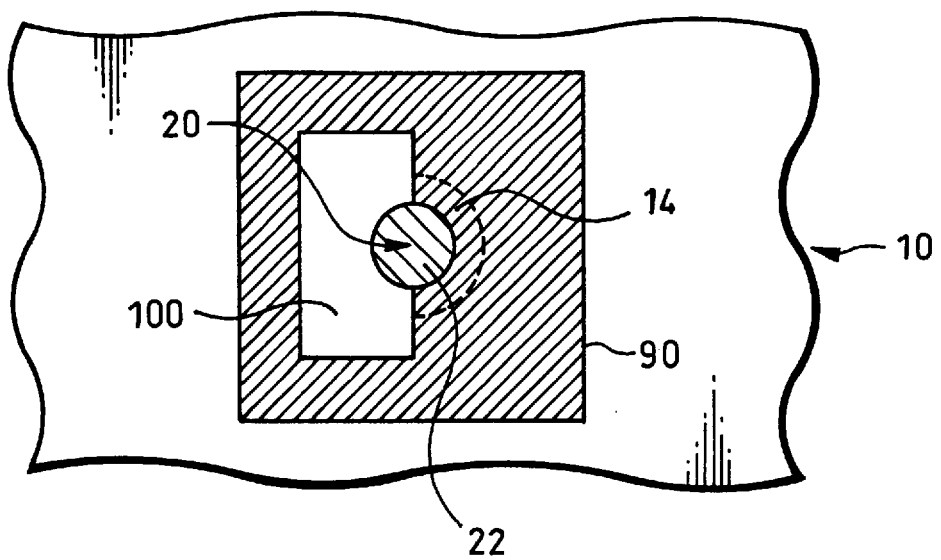
FIG. 7 is a diagram showing an example of still another copper foil non-formation part provided in the vicinity of a via hole.

FIG. 7 shows still another embodiment of the present invention, with a solid copper foil 90 connected electrically to the half of the peripheral part of the copper foil 14. However, the other half of the peripheral part of the copper foil 14 is eliminated, besides, a part of the solid copper foil 90 is eliminated as well. Accordingly, a copper foil non-formation part 100 is formed. Since the out gas can be released from the copper foil non-formation part 100, the burst phenomenon and the void phenomenon by the out gas in the copper paste can be cut back.

Formation of the copper foil non-formation parts 60, 80, 100 as shown in FIGS. 5 to 7 are executed before filling the copper paste 22 into the via hole 20 by screen printing as shown in FIG. 1B.

Results of the comparison between the generation rate of the burst in the via hole disposed in the conventional solid copper foil and the generation rate of the burst in the embodiment of the present invention are as follows. The effects can be observed. The substrate was prebaked at about 150° C. or less before the copper paste printing. In this case, a substrate of a paper phenol MCL-437F produced by Hitachi Kasei Kogyo Corp. with a 1.6 mm thickness was used with a 0.6 mm drill diameter for the via hole formation. A copper paste NF2000 produced by Tatsuta Densen Corp. was used. The copper foil non-formation part has a 2 mm by 2 mm square shape. A 0.5 mm width copper foil land was connected at four points.

TABLE 2

| | Conventional example | Embodiment of the present invention (independent land type) |
|---|---|---|
| Burst generation rate | 100% | 18% |

According to the embodiment of the present invention, since the problem of the burst void failure in the copper paste can be solved in the paper phenol substrate, the PWB having a copper paste through hole can be realized with the most inexpensive substrate.

In the present embodiment, the through hole is provided in the vicinity of the via hole for the copper paste to produce a copper paste through hole PBW, using copper clad laminates for a rigid-printed wiring board with a paper phenol or a paper epoxy used as a base.

Or in the case of disposing the via hole for the copper paste in the solid copper foil, the copper foil land for the via hole is provided independent from the solid copper foil, with the solid copper foil and the copper foil land for the via hole connected by the fine line copper foil pattern to produce a copper paste through hole PBW, using copper clad laminates for a rigid-printed wiring board with a paper phenol or a paper epoxy used as a base.

In producing a rigid-printed wiring board according to the present invention, in a production method of a rigid-printed wiring board comprising copper clad laminates with a paper phenol or a paper epoxy used as a base, the through hole is provided in the vicinity of the via hole for filling the copper paste, and the copper paste is filled in the via hole, dried, and thermally cured.

In producing a rigid-printed wiring board according to the present invention, in a production method of a rigid-printed wiring board comprising copper clad laminates with a paper phenol or a paper epoxy used as a base, the copper foil land for a via hole for filling the copper paste and the copper foil part in the periphery thereof are formed separately such that the copper foil land for the via hole and the copper foil part in the periphery thereof are connected electrically so as for the copper foil non-formation part to be provided between the copper foil land for the via hole and the copper foil part in the periphery thereof, and the copper paste is filled in the via hole, dried and thermally cured.

The present invention is not limited to the above-mentioned embodiments.

As to the shape of the through hole and the shape of the non-formation part described in the embodiments, of course other shapes can be adopted as well. In producing a rigid-printed wiring board according to the embodiments of the present invention, even in the case where copper clad laminates with a paper epoxy used as a base is used instead of a paper phenol, the burst void phenomenon by the out gas can be similarly prevented as in the case of the paper phenol. Of course, other kinds of inexpensive copper clad laminates like the paper phenol or the paper epoxy can also be used as well.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A production method of a rigid-printed wiring board comprising copper clad laminates with a paper phenol or a paper epoxy used as a base, wherein
- a degassing through hole is provided in the vicinity of a via hole for filling a copper paste, and
- the copper paste is filled in the via hole, dried, and thermally cured.

2. A production method of a rigid-printed wiring board comprising copper clad laminates with a paper phenol or a paper epoxy used as a base, wherein
- a copper foil land for a via hole for filling a copper paste and a copper foil part in the periphery thereof are formed separately such that the copper foil land for the via hole and the copper foil part in the periphery thereof are connected electrically so as for a copper foil non-formation part to be provided between the copper foil land for the via hole and the copper foil part in the periphery thereof,
- comprising the steps of filling the copper paste in the via hole, and drying as well as thermally curing it.

* * * * *